United States Patent [19]

Motté

[11] Patent Number: 5,038,116
[45] Date of Patent: Aug. 6, 1991

[54] OSCILLATOR SYNCHRONIZING CIRCUIT STABILIZED AGAINST LOSS OF SYNC SIGNALS

[75] Inventor: Bruno P. J-M. Motté, Nijmegen, Netherlands

[73] Assignee: U.S. Philips Corporation, New York, N.Y.

[21] Appl. No.: 535,922

[22] Filed: Jun. 11, 1990

[30] Foreign Application Priority Data

Jul. 4, 1989 [NL] Netherlands ............... 8901696

[51] Int. Cl.$^5$ .......................... H03L 7/085
[52] U.S. Cl. .......................... 331/8; 331/14; 331/17; 331/20; 331/27; 358/158
[58] Field of Search ............... 331/8, 14, 17, 20, 25, 331/27; 358/158, 159

[56] References Cited

U.S. PATENT DOCUMENTS 3,882,412  5/1975  Apple, Jr. .................. 331/25 X
4,061,979  12/1977  Walker et al. ............... 331/17 X
4,360,781  11/1982  Sochor ....................... 331/17 X Primary Examiner—Siegfried H. Grimm
Attorney, Agent, or Firm—Edward W. Goodman

[57] ABSTRACT

A synchronizing circuit including an oscillator, a phase discriminator having a first input coupled to an input terminal of the circuit for receiving an incoming synchronizing signal, a second input for receiving a signal derived from the oscillator and an output for applying a control signal to a control input of the oscillator for controlling the frequency and/or the phase of the oscillator signal. To ensure that the action of the circuit is not disturbed when no signal is present at the input terminal of the circuit, the circuit includes an auxiliary circuit for reducing the difference between the signal at the output of the phase discriminator and a reference, the auxiliary circuit being active in response to a synchronizing signal detector at the output of the phase discriminator in the absence of the incoming synchronizing signal and inactive in the opposite case.

7 Claims, 1 Drawing Sheet

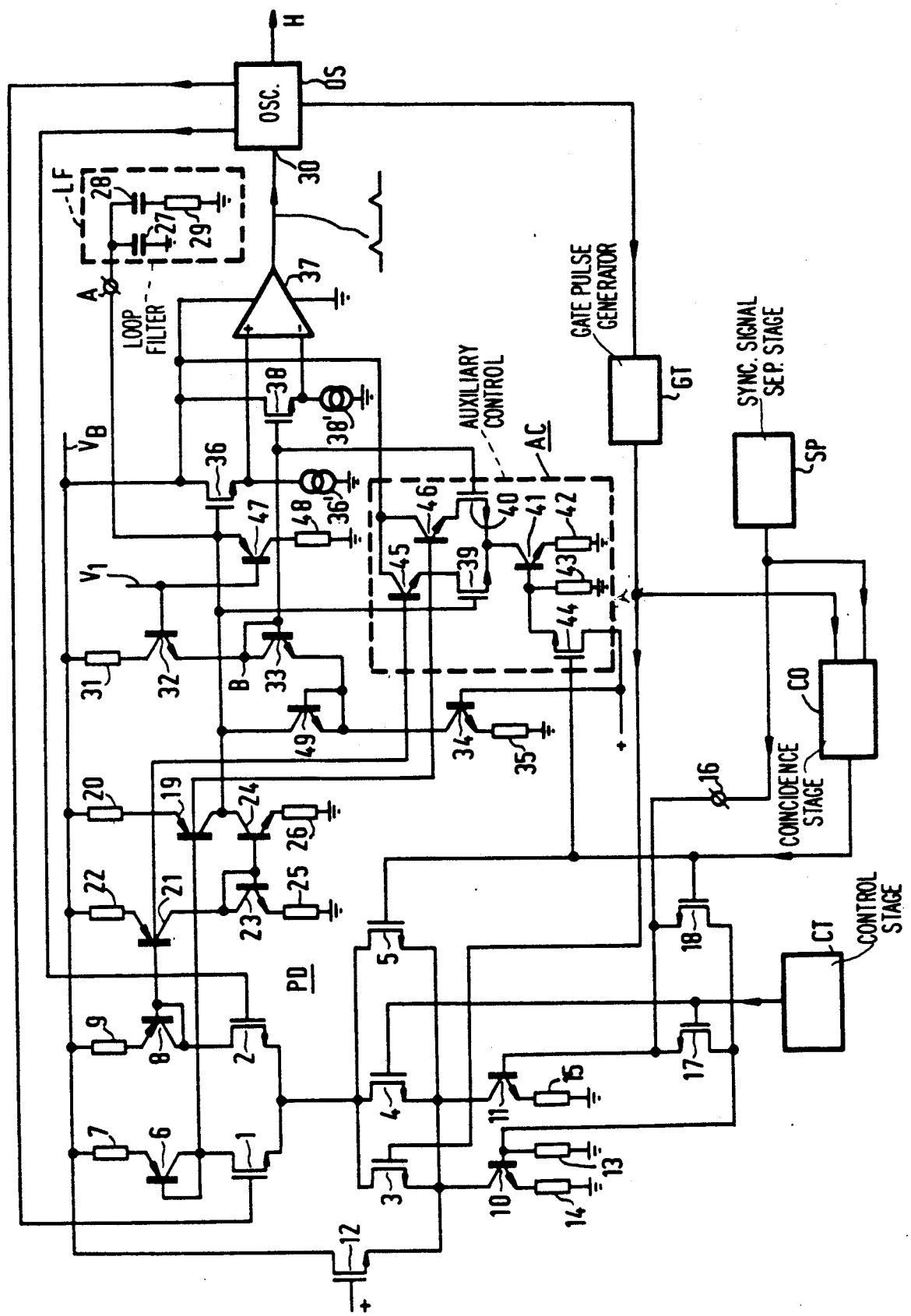

OSCILLATOR SYNCHRONIZING CIRCUIT STABILIZED AGAINST LOSS OF SYNC SIGNALS

FIELD OF THE INVENTION

The invention relates to a synchronizing circuit including an oscillator, a phase discriminator having a first input coupled to an input terminal of the circuit for receiving an incoming synchronizing signal, a second input for receiving a signal derived from the oscillator and an output for applying a control signal to a control input of the oscillator for controlling the frequency and/or the phase of the oscillator signal, and further including a synchronizing signal detector coupled to the input terminal of the circuit for establishing whether the incoming synchronizing signal is present or not.

DESCRIPTION OF THE RELATED ART

Such a synchronizing circuit is disclosed in the U. S. Pat. No. 3,882,412. In this prior-art circuit, the control signal applied to the control input of the oscillator varies such that in the steady state of the control loop formed, the input signals of the phase discriminator are substantially in synchronism. The circuit comprises a memory constituted by a counter having a counting value which depends on the phase difference between said input signals. If at a given constant the incoming synchronizing signal drops out, then, in response to the synchronizing signal detector, the instantaneous value of the counter is stored and applied to the oscillator. Consequently, as long as the incoming signal is absent, the control continues to be operative, so that the oscillator is not free but continues to oscillate in the same manner as at the instant at which the incoming signal disappeared.

The prior-art circuit has for its object to compensate for changes which may occur at a very accurately operating oscillator and which are caused by temperature and aging effects. These are usually small and slow changes, so that in the absence of the incoming synchronizing signal, the frequency of the oscillator signal deviates only little from the frequency in the presence of this signal. In uses in which such a high stability is not required or not possible, for example in consumer apparatus, it is however possible that at the instant at which the incoming signal drops out or at least becomes weak, the control signal can evidence a large difference relative to the target value. If the apparatus includes such a synchronizing circuit provided with a memory, then for the period of time in which the synchronizing signal is weak, the oscillator signal continues to have a frequency which deviates from the target value. This may have unacceptable results. If, for example, the apparatus is a picture display device, the picture displayed is unviewable. In addition, the time required for pulling in the control after the reappearance of the synchronizing signal, or after the instant at which this signal has again a workable strength, can be unacceptably long.

Summary of the Invention

The invention has for its object to provide a synchronizing signal of the above-defined type which does not have these disadvantages, and to that end a circuit according to the invention, is characterized by an auxiliary circuit for reducing the difference between the signal at the output of the phase discriminator and a reference, the auxiliary circuit being active at the phase discriminator output in response to the synchronizing signal detector in the absence of the incoming synchronizing signal and inactive in the opposite case.

Therefore, in the absence of the synchronizing signal, or when this signal is weak, the measure in accordance with the invention provides that the output of the phase discriminator has a defined signal value which is not determined by noise or by leakage currents in the phase discriminator. If, thereafter, a synchronizing signal of an adequate strength is available at the input terminal of the circuit, then the circuit pulls in very rapidly, as a result of which the oscillator assumes the same frequency and substantially the same phase as the incoming synchronizing signal. The measure according to the invention ensures that the sensitivity of the control loop is reduced in the absence of the synchronizing signal. The loop can consequently be dimensioned for a very high gain in the presence of this signal, so that the phase error is substantially zero in the steady state of the loop.

The auxiliary circuit may be a circuit for arranging a resistor in series with a switch which is arranged between the output of the phase discriminator and the reference and is controllable by the synchronizing signal detector.

Preferably, a circuit in accordance with the invention is characterized in that the auxiliary circuit is a control circuit for maintaining the difference between the signal and the phase discriminator output and the reference at zero. The said resistor has namely a very high value, such that a small current therethrough is sufficient to produce a voltage drop to enable pull-in of the oscillator. Such a resistor is hard to integrate in an integrated circuit. When the measure just proposed is used, the auxiliary circuit operates as the said resistor and is indeed easy to integrate.

Advantageously, the reference may be chosen such that it has a value at which the signal at the second input of the phase discriminator has substantially the same frequency as the incoming synchronizing signal, if present. This still further reduces the pull-in time at the reappearance of the synchronizing signal.

The synchronizing signal detector may be of a strucure as that of the prior-art circuit. Advantageously, this detector may be implemented as a coincidence stage for receiving the incoming synchronizing signal and a signal derived from the oscillator, for example in the case such a stage is already present, for example for switching certain quantities of the circuit. As is known, in response to such a stage, the loop gain can be switched between two values.

Brief Description of the Drawing

The invention will now be described in greater detail by way of example with reference to the accompanying Figure.

Description of the Preferred Embodiment

The Figure shows that portion of a line synchronizing circuit for a picture display device, for example a television receiver, that is relavant to the invention. Herein two field effect transistors 1 and 2 of the NMOS-type form part of a phase discriminator PD. Transistors 1 and 2 are symmetrically driven by signals supplied by an oscillator OS, that is to say signals which are in anti-phase are applied to the gates of the transistors. Both sources are interconnected and are connected to the drain electrodes of three further NMOS transistors 3, 4 and 5. The drain of transistor 1 is connected to the base and to the collector of a bipolar transistor 6 of the pnp-type whose emitter is connected to the positive pole of a supply voltage source $V_B$ via a resistor 7. In a similar manner, the drain of transistor 2 is connected to the base and to the collector of a pnp-transistor 8 whose emitter is connected to the positive pole $V_B$ via a resistor 9. The negative pole of source $V_B$ is connected to ground. The sources of transistors 3, 4 and 5 are interconnected, and are connected to the collectors of two bipolar npn-transistors 10 and 11, and to the source of an NMOS transistor 12 whose gate is connected to a positive d.c. voltage and whose drain is connected to voltage $V_B$. A resistor 13 is connected to the base of transistor 10 and a resistor 14 is connected to the emitter. A resistor 15 is connected to the emitter of transistor 11. Resistors 13, 14 and 15 have their other terminal connected to ground. The base of the transistor 11 is connected to an input terminal 16 and to the sources of two NMOS transistors 17 and 18. Terminal 16 constitutes an input terminal for the present circuit, the ouput of a synchronizing signal separating stage SP is connected thereto. The drain electrodes of transistors 17 and 18 are interconnected and are connected to the base of transistor 10. The gate of transistor 3 is connected to an output of a gate pulse generator GT. The gates of transistors 4 and 17 are interconnected and are connected to an output of a control stage CT. Finally, the gates of transistors 5 and 18 are interconnected and connected to an output of a coincidence stage CO.

In operation, in normal circumstances, the input signals of the phase discriminator PD are present, more specifically the signals originating from the oscillator OS and a line synchronizing signal is derived from an incoming video signal and originating from the synchronizing signal separating stage SP. In the synchronized state of the synchronizing circuit, i.e. a state in which the oscillator signal between the gates of transistors 1 and 2 are of the same frequency and substantially the same phase as an incoming line synchronizing pulse, transistors 3 and 11 are conducting during the occurrence of such a pulse, while transistors 4, 5, 17 and 18 are kept in the non-conductive state by the signals present at the gates of these transistors, as a result of which transistor 10 is also in the non-conductive state. In said synchronized state, a pulse edge of the oscillator signal occurs substantially halfway the synchronizing pulse. Prior thereto, one of the transistors 1 and 2 is conducting, whereafter the other transistor is conducting.

The drain of transistor 1 is also connected to the base of a pnp-transistor 19 whose emitter is connected to a resistor 20, and the drain of transistor 2 is also connected to the base of an pnp-transistor 21 whose emitter is connected to a resister 22. Resistors 20 and 22 have their other terminals connected to voltage $V_B$. The base and the collector of an npn-transistor 23 are interconnected, and are connected to the collector of transistor 21 and to the base of a further npn-transistor 24. The emitter of transistor 23 is connected to ground via a resistor 25 and the emitter of transistor 24 is connected to ground via a resistor 26. The collector of transistor 24 is connected to the collector of transistor 19 and to a terminal A of an integrated circuit of which the majority of components of the described circuit form part. Point A constitutes the output of discriminator PD to which a loop filter LF is connected. Filter LF is constituted by, for example, a first capacitor 27 arranged between point A and ground and the series arrangement of a second capacitor 28 and a resistor 29, which series arrangement is in parallel with capacitor 27.

Transistors 6 and 19 form a current mirror circuit for the collector current of transistor 1, and transistors 8 and 21, on the one hand, and transistors 23 and 24, on the other hand, form a current mirror circuit for the collector current of transistor 2. During the first half of the occurrence of the line synchronizing pulse one of said collector currents flows, in response to which one of the transistors 19 and 24 is conductive for charging or discharging, respectively, the capacitors of filter LF, and during the second half of the occurrence of the synchronizing pulse, the other collector current flows, in reponse to which the capacitors are discharged or charged, respecively. A voltage derived from the voltage present at point A is applied to a control input 30 of oscillator OS. In the synchronized state of the phase control loop comprising the elements PD, LF and OS, the voltage applied to the control input 30 hrs, during the occurrence of the synchronizing pulse, the shape of a triangle which is symmetrical relative to the center of the pulse. In the remaining part of the period, transistors 19 and 24 are in the non-conducting state and this voltage keeps approximately the value at the end of the triangle: said voltage is a control voltage for maintaining the frequency and the phase of the oscillator signal at the correct values. If the symmetry is disturbed, then the periods of time in which charging and discharging occur are no longer equal to each other, which results in the control voltage having another value after the occurrence of the synchronizing pulse than it would have in the synchronized state. The control then ensures that in the course of time, the symmetry is recovered, as a result of which the edge of the oscillator signal again coincides with the center of the pulse.

The gate pulse generator GT is coupled to oscillator OS and generates gate pulses which are derived from the oscillator signal and whose duration is somewhat longer than the duration of the line synchronizing pulses. In the synchronized state of the control loop, the gate pulses are located symmetrically relative to the centers of the synchronizing pulses. Whether this state is at least almost present is ascertained by means of the coincidence stage CO. To that end line synchronizing pulses and pulses derived from the oscillator signal, for example said gate pulses, are applied to stage CO. If coincidence has occurred once or a predetermined number of times, at least during a portion of the duration of the occurrence of the pulses applied to stage CO, then stage CO does not generate a signal, so that transistors 5 and 18 remain non-conducting. By means of transistor 3, which is maintained in the conductive state during the occurrence of a gate pulse, it is ensured that discriminator PD is operative only during the occurrence of the gate pulse. If, in contrast thereto, non-coincidence is detected, then stage CO generates a positive d.c. voltage, causing transistors 5 and 18 to be rendered conductive. During the occurrence of a line synchronizing pulse transistors 10 and 11 conduct. Since transistor 5 is conducting, the gate pulses are without influence and discriminator Pd is operative during the overall period and since both transistors 10 and 11 are conducting, the control loop has a higher gain. The same mode of operation is obtained by rendering transistors 4 and 17 conductive by means of a signal originating from stage CT, irrespective of the fact whether there is coincidence or no coincidence, for eample on reception of a video signal from a video recorder.

All the facts described in the foregoing are known to a person skilled in the art. The circuit may include further prior-art provisions, for example for changing-over the loop gain in given circumstances, for changing the mode of operation of the circuit during the field blanking interval, etc.

The series arrangement of a protection resistor 31, the collector-emitter path of three npn-transistors 32, 33 and 34, and a resistor 35 is arranged between the positive pole of source $V_B$ and ground. The base of transistor 32 is connected to a positive voltage $V_1$. The base and the collector of transistor 33 are interconnected and the base of transistor 34 is connected to a positive d.c. voltage. Point A is connected to the gate of an NMOS transistor 36 which operates as a source follower and whose source is connected to a current source 36' and to a non-inverting input of a differential amplifier 37. The junction point B of the emitter of transistor 32 and the collector of transistor 33 is connected to the gate of a NMOS transistor 38 which operates as a source follower and whose source is connected to a current source 38' and to an inverting input of amplifier 37. An output of amplifier 37 is connected to the control input 30 of oscillator OS. A voltage equal to $V_1 - v_{be}$, wherein $v_{be}$ denotes the base-emitter threshold voltage of the conducting transistor 32, is present across junction point B. Due to the action of the control loop, the input voltages of amplifier 37 have, in the synchronized state of the loop, substantially the same value, as a result of which the voltage at point A is approximately equal to the voltage at junction point B. The output voltage of amplifier 37 is the control voltage for oscillator OS and is substantially zero in the synchronized state, whereby the oscillator signal applied to transistor 1 and 2 has the same frequency and substantially the same phase as the line synchronizing signal, the oscillator signal having the line frequency or a multiple thereof. In the latter case, a frequency divider is arranged between the oscillator and the phase discriminator PD. A line signal obtained by the present circuit is additionally applied to a line deflection circuit H, not shown, for the deflection in the horizontal direction of one or more electron beam(s) in a picture display tube.

If the incoming line synchronizing signal drops out or if this signal is very weak, then a great deal of noise is present at the output of stage SP. In these circumstances, without further measures, the voltage at point A is no longer defined after some time since the capacitors 27 and 28 of filter LF discharge and since all kinds of leakage currents flow which are integrated by filter LF and vary inter alia versus temperature. This may cause the voltage at point A to assume an incorrect value, as a result of which oscillator OS cannot oscillate any more at the correct frequency, which may cause pull-in problems at the recurrence of a line synchronizing signal of significant strengh.

So as to ensure that also in the case jet described the control voltage has a well-defined value, the circuit comprises, in accordance with the invention, the following components. Point A is connected to the gate of an NMOS transistor 39 whose source is connected to the source of a further NMOS transistor 40 and to the collector of a npn-transistor 41. The emitter of transistor 41 is connected to a resistor 42, and the base to a resistor 43 and to the source of an NMOS transistor 44. The gate of transistor 44 is connected to the output of stage CO and the drain is connected to the voltage to which also the base of transistor 34 is connected. Resistors 42 and 43 have their other terminals connected to ground. The drain of transistor 39 is connected to the emitter of an npn-transistor 45 whose base is connected to the collector of transistor 8 and whose collector is connected to voltage $V_B$. Similarly, the drain of transistor 40 is connected to the emitter of an npn-transistor 46 whose base is connected to the collector of transistor 6 and whose collector is connected to voltage $V_B$. The gate of transistor 40 is connected to junction point B.

When stage CO has detected coincidence, the voltage at the gate of transistor 44 is zero and this transistor is cut-off. Transistors 39, 40, 41, 45 and 46 are also cut-off and the control of oscillator OS is effected in the manner described in the foregoing. If, in contrast thereto, no coincidence is detected, for example because no line synchronizing signal is present at the input 16 of the circuit, then the gate of transistor 44 is connected to a positive d.c. voltage. Transistors 44 and 41 are conductive, causing the differential amplifier constituted by the transistors 39 and 40 to be operative. A current $I_1$ flows through transistors 39 and 45 and a current $I_2$ flows through transistors 40 and 46. In response thereto a current $I_1/\beta$ originating from transistor 8, $\beta$ being the current amplification factor of the transistor, flows to the base of transistor 45, and a current $I_2/\beta$ originating from transistor 6 flows to the base of transistor 46. In this situation, the current amplification factors of both transistors, which form part of the same integrated circuit, are assumed to be equal. If the voltage at point A increases to above the target value $V_1 - v_{be}$, then current $I_1$ increases and current $I_2$ decreases. Consequently, the collector current of transistor 8 increases while the collector current of transistor 6 decreases. This implies that the collector current of transistor 19, which flows to point A to charge capacitors 27 and 28, decreases while the collector current of transistor 24, which flows from point A to discharge the capacitors, increases, which counteracts the increase of the voltage at point A. Any decrease is counteracted in a similar manner. From this, it appears that elements 39 to 46, inclusive, form a circuit AC for an auxiliary control, such that in the case of non-coincidence in stage CO, a voltage difference between points A and B cause an additional (offset) current in the phase discriminator with the object of reducing this difference, as a result of which the input voltages of amplifier 37 become substantially equal and the oscillator signal has substantially the correct frequency. For this purpose, a separate source can alternatively be chosen, which is coupled to point A. Since a voltage difference between the voltages at points A and B produces a current difference depending on this difference, circuit AC is operative as a resistor connected to the output of the phase discriminator between points A and B. This artificial resistor has a very high value, in the order of some hundreds of kilo-Ohms. A small current flowing through the resistor is sufficient to produce such a voltage drop thereacross that the oscillator rapidly pulls in. The resistor is only present in the case of non-coincidence, the coincidence detector having for its object to indicate whether a synchronizing signal is present or not. It will be obvious that circuit AC can be replaced by an ohmic resistor arranged in series with a controllable switch operated by the coincidence detector, the series arrangement formed being arranged between points A and B. In view of the high value of the resistor, it is however not integrable, which requires an additional terminal for connection to the integrated circuit. By applying the resistor between points A and B, the direct current gain of the control loop, so its sensitivity, is diminished in the absence of a synchronizing signal. Thanks to this measure the loop can be dimensioned for a very high gain in the presence of this signal, so that in the steady state of the loop the phase error is very small.

The circuit of the Figure additionally includes a pnp-transistor 47 whose base is connected to voltage $V_1$, the emitter is connected to point A and the collector to a resistor 48 which has its other terminal connected to ground, as well as an npn-transistor 49 whose base and emitter are interconnected and are connected to the emitter of transistor 33 and whose collector is connected to point A. These transistors are provided to limit the possible variations of the voltage at point A. If during the control procedure the voltage at point A exceeds the value $V_1 + v_{be}$, then transistor 47 is rendered conductive, as a result of which the voltage at point A cannot increase still further. If, in contrast thereto, the voltage at point A falls below the value $V_1 - 3v_{be}$, then transistor 49, the base and the emitter of which carry the voltage $V_1 - 2v_{be}$ because of the presence of transistor 33, becomes conductive, so that the voltage cannot decrease to a further extent. It is assumed here that the $v_{be}$'s in the integrated circuit are equal. It consequently appears that the voltage at point A can vary by not more than $2v_{be}$ around the target value.

I claim:

1. A synchronizing circuit including an oscillator, a phase discriminator having a first input coupled to an input terminal of the circuit for receiving an incoming synchronizing signal, a second input for receiving a signal derived from the oscillator and output for applying a control signal to a control input of the oscillator for controlling the frequency and/or phase of the oscillator signal and further including a synchronizing signal detector coupled to the input terminal of the circuit for establishing whether the incoming synchronizing signal is present or not, characterized in that the synchronizing circuit further comprises an auxiliary circuit for reducing the difference between the signal at the output of the phase discriminator and a reference, the auxiliary circuit being active at the phase discriminator output in response to the synchronizing signal detector in the absence of the incoming synchronizing signal and inactive in the opposite case wherein the auxiliary circuit is a circuit for arranging a resistor in series with a switch which is arranged between the output of the phase discriminator and the reference and is controllable by the synchronizing signal detector.

2. A synchronizing circuit including an oscillator, a phase discriminator having a first input coupled to an input terminal of the circuit for receiving an incoming synchronizing signal, a second input for receiving a signal derived from the oscillator and an output for applying a control signal to a control input of the oscillator for controlling the frequency and/or phase of the oscillator signal, and further including a synchronizing signal detector coupled to the input terminal of the circuit for estalishing whether the incoming synchronizing signal is present or not, characterized in that the synchronizing circuit further comprises an auxiliary circuit for reducing the difference between the signal at the output of the phase discriminator and a reference, the auxiliary circuit being active at the phase discriminator output in response to the synchronizing signal detector in the absence of the incoming synchronizing signal and inactive in the opposite case, wherein the auxiliary circuit is a control circuit for maintaining the difference between the signal at the phase discriminator output and the reference at zero and wherein the auxiliary circuit includes a differential amplifier having a first input coupled to the output of the phase discriminator and a second input coupled to the reference, and an output coupled to a source for determining the voltage at the ouput of the phase discriminator, the differential amplifier being operative in response to the synchronizing signal detector in the absence of the incoming synchronizing signal and is inactive in the opposite case.

3. A synchronizing circuit as claimed in claim 2, characterized in that the auxiliary circuit comprises a first transistor having a first input electrode constituting the first input of the differential amplifier, a second transistor having a first input electrode constituting the second input of the differential amplifier, a third transistor having a first input electrode connected to an output electrode of the first transistor, and a fourth transistor having a first input electrode connected to an output electrode of the second transistor, a second input electrode of the third transistor and a second input electrode of the fourth transistor being coupled to the source for determining the voltage at the output of the phase discriminator, and a second input electrode of the first transistor being connected to a second input electode of the second transistor and to an output electrode of the fifth transistor having an input electrode coupled to the synchronizing signal detector.

4. A circuit as claimed in claim 2, wherein a loop filter is connected to the output of the phase discriminator for integrating the current from a current source which forms part of the phase discriminator, characterized in that the output of the differential amplifier is coupled to the current source for determining the voltage at the output of the phase discriminator.

5. A synchronizing circuit including an oscillator, a phase discriminator having a first input coupled to an input terminal of the circuit for receiving an incoming synchronizing signal, a second input for receiving a signal derived from the oscillator and an output for applying a control signal to a control input of the oscillator for controlling the frequency and/or phase of the oscillator signal, and further including a synchronizing signal detector coupled to the input terminal of the circuit for establishing whether the incoming synchronizing signal is present or not, characterized in that the synchronizing circuit further comprises an auxiliary circuit for reducing the difference between the signal at the output of the phase discriminator and a reference, the auxiliary circuit being active at the phase discriminator output in response to the synchronizing signal detector in the absence of the incoming synchronizing signal and inactive in the opposite case, wherein the reference has a value for which the signal at the second input of the phase discriminator has substantially the same frequency s the incoming synchronizing signal, if present and wherein said synchronizing circuit further comprises a differential amplifier a first input of which is coupled to the output of the phase discriminator, a second input to the reference and an output to the control input of the oscillator.

6. A circuit as claimed in claim 5, characterized in that the output of the phase discriminator is connected to a double-ended limiter to limit variations of the voltage at the said output.

7. A synchronizing circuit including an oscillator, a phase discriminator having a first input coupled to an input terminal of the circuit for receiving an incoming synchronizing signal, a second input for receiving a signal derived from the oscillator and an output for applying a control signal to a control input of the oscillator for controlling the frequency and/or phase of the oscillator signal, and further including a synchronizing signal detector coupled to the input terminal of the circuit for establishing whether the incoming synchronizing signal is present or not, characterized in that the synchronizing circuit further comprises an auxiliary circuit for reducing the difference between the signal at the output of the phase discriminator and a reference, the auxiliary circuit being active at the phase discriminator output in response to the synchronizing signal detector in the absence of the incoming synchronizing signal and inactive in the opposite case, characterized in tht the synchronizing signal detector is implemented as a coincidence stage for receiving the incoming synchronizing signal and a signal derived from the oscillator.

* * * * *